(12) United States Patent
Miwa et al.

(10) Patent No.: US 11,799,084 B2
(45) Date of Patent: *Oct. 24, 2023

(54) METHOD FOR MAKING LIFEPO₄ BY HYDROTHERMAL METHOD

(71) Applicant: SEMICONDUCTOR ENERGY LABORATORY CO., LTD., Atsugi (JP)

(72) Inventors: Takuya Miwa, Kanagawa (JP); Kuniharu Nomoto, Saitama (JP); Junpei Momo, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/692,502

(22) Filed: Mar. 11, 2022

(65) Prior Publication Data

US 2022/0199998 A1    Jun. 23, 2022

Related U.S. Application Data

(63) Continuation of application No. 16/388,904, filed on Apr. 19, 2019, now Pat. No. 11,283,075, which is a continuation of application No. 14/948,965, filed on Nov. 23, 2015, now Pat. No. 10,270,097, which is a continuation of application No. 13/588,251, filed on Aug. 17, 2012, now Pat. No. 9,249,524.

(30) Foreign Application Priority Data

Aug. 31, 2011  (JP) .................... 2011-189027

(51) Int. Cl.

| | | |
|---|---|---|
| H01M 4/00 | (2006.01) | |
| H01M 4/58 | (2010.01) | |
| C01D 15/02 | (2006.01) | |
| C01G 45/00 | (2006.01) | |
| C01G 49/00 | (2006.01) | |
| C01G 51/00 | (2006.01) | |
| C01G 53/00 | (2006.01) | |
| C30B 7/10 | (2006.01) | |
| H01M 4/36 | (2006.01) | |
| H01M 4/587 | (2010.01) | |
| C30B 29/14 | (2006.01) | |
| H01M 4/02 | (2006.01) | |

(52) U.S. Cl.
CPC .......... H01M 4/5825 (2013.01); C01D 15/02 (2013.01); C01G 45/006 (2013.01); C01G 49/009 (2013.01); C01G 51/006 (2013.01); C01G 53/006 (2013.01); C30B 7/10 (2013.01); H01M 4/364 (2013.01); H01M 4/587 (2013.01); C30B 29/14 (2013.01); H01M 2004/028 (2013.01); H01M 2220/30 (2013.01)

(58) Field of Classification Search
CPC .... H01M 4/5825; H01M 4/364; H01M 4/587; C01D 15/02; C01G 45/006; C01G 49/009; C01G 51/006; C01G 53/006
USPC ........................................................ 423/306
See application file for complete search history.

(56) References Cited

U.S. PATENT DOCUMENTS

| | | |
|---|---|---|
| 4,302,518 A | 11/1981 | Goodenough et al. |
| 4,321,114 A | 3/1982 | MacDiarmid et al. |
| 4,668,595 A | 5/1987 | Yoshino et al. |
| 5,783,333 A | 7/1998 | Mayer |
| 5,871,866 A | 2/1999 | Barker et al. |
| 5,910,382 A | 6/1999 | Goodenough et al. |
| 6,085,015 A | 7/2000 | Armand et al. |
| 6,514,640 B1 | 2/2003 | Armand et al. |
| 6,913,855 B2 | 7/2005 | Stoker et al. |
| 7,179,561 B2 | 2/2007 | Niu et al. |
| 7,445,871 B2 | 11/2008 | Suh et al. |
| 7,572,542 B2 | 8/2009 | Naoi |
| 7,658,901 B2 | 2/2010 | Prud'Homme et al. |
| 7,718,314 B2 | 5/2010 | Komiyama et al. |
| 7,745,047 B2 | 6/2010 | Zhamu et al. |
| 7,749,655 B2 | 7/2010 | Doh et al. |
| 7,807,121 B2 | 10/2010 | Nuspl et al. |
| 7,842,432 B2 | 11/2010 | Niu et al. |
| 7,939,218 B2 | 5/2011 | Niu |
| 7,977,007 B2 | 7/2011 | Niu et al. |
| 7,977,013 B2 | 7/2011 | Niu et al. |
| 7,998,618 B2 | 8/2011 | Nuspl et al. |

(Continued)

FOREIGN PATENT DOCUMENTS

| | | |
|---|---|---|
| CN | 001867514 A | 11/2006 |
| CN | 001876565 A | 12/2006 |

(Continued)

OTHER PUBLICATIONS

Kang.B et al., "Battery Materials for Ultrafast Charging and Discharging", Nature, Mar. 12, 2009, vol. 458, No. 7235, pp. 190-193.

Zhou.F et al., "The Li intercalation potential of LiMPO4 and LiMSiO4 olivines with M = Fe, Mn, Co, Ni", Electrochemistry Communications, Nov. 1, 2004, vol. 6, No. 11, pp. 1144-1148.

Yang.S et al., "Hydrothermal Synthesis of Lithium Iron Phosphate Cathodes", Electrochemistry Communications, 2001, vol. 3, No. 9, pp. 505-508.

Liang.G et al., "Anisotropy in magnetic properties and electronic structure of single-crystal LiFePO4", Phys. Rev. B (Physical Review. B), 2008, vol. 77, pp. 064414-1-064414-12.

(Continued)

Primary Examiner — Steven J Bos
(74) Attorney, Agent, or Firm — NIXON PEABODY LLP; Jeffrey L. Costellia

(57) ABSTRACT

A hydrothermal synthesis for LiFePO₄ is provided. First, each raw material solution is prepared using a degassed water in advance, second, those solution are mixed by dripping in a fixed order, and then those materials are reacted in a hydrothermal synthesis, so that LiFePO₄ is obtained in a predesigned form.

2 Claims, 9 Drawing Sheets

(56) References Cited

U.S. PATENT DOCUMENTS

| | | | |
|---|---|---|---|
| 8,053,075 B2 | 11/2011 | Schall et al. | |
| 8,097,362 B2 | 1/2012 | Isono | |
| 8,133,616 B2 | 3/2012 | Exnar et al. | |
| 8,278,011 B2 | 10/2012 | Zhu et al. | |
| 8,317,984 B2 | 11/2012 | Gilje | |
| 8,460,573 B2 | 6/2013 | Nakano et al. | |
| 8,658,316 B2 | 2/2014 | Kitagawa et al. | |
| 8,663,847 B2 | 3/2014 | Kashiwa et al. | |
| 8,673,497 B2 | 3/2014 | Hibst et al. | |
| 8,895,190 B2 | 11/2014 | Chang et al. | |
| 9,005,481 B2 | 4/2015 | Yoshida et al. | |
| 9,118,077 B2 | 8/2015 | Miwa et al. | |
| 9,225,022 B2 | 12/2015 | Kohmoto et al. | |
| 9,242,864 B2 | 1/2016 | Nuspl et al. | |
| 9,249,524 B2 | 2/2016 | Miwa et al. | |
| 9,431,675 B2 | 8/2016 | Guerfi et al. | |
| 10,270,097 B2 | 4/2019 | Miwa et al. | |
| 11,283,075 B2 * | 3/2022 | Miwa | C30B 7/10 |
| 2001/0010807 A1 | 8/2001 | Matsubara | |
| 2002/0195591 A1 | 12/2002 | Ravet et al. | |
| 2003/0091900 A1 | 5/2003 | Numata et al. | |
| 2004/0096743 A1 | 5/2004 | Okae et al. | |
| 2006/0051671 A1 | 3/2006 | Thackeray et al. | |
| 2007/0054187 A1 | 3/2007 | Nuspl et al. | |
| 2007/0131915 A1 | 6/2007 | Stankovich et al. | |
| 2007/0152185 A1 | 7/2007 | Gauthier et al. | |
| 2008/0206650 A1 | 8/2008 | Kim et al. | |
| 2008/0222881 A1 | 9/2008 | Yu et al. | |
| 2008/0248382 A1 | 10/2008 | Sastry et al. | |
| 2008/0254296 A1 | 10/2008 | Handa et al. | |
| 2008/0268339 A1 | 10/2008 | Suzuki | |
| 2009/0087660 A1 | 4/2009 | Suzuki et al. | |
| 2009/0110627 A1 | 4/2009 | Choi et al. | |
| 2009/0117022 A1 | 5/2009 | Nuspl et al. | |
| 2009/0117467 A1 | 5/2009 | Zhamu et al. | |
| 2009/0197174 A1 | 8/2009 | Levassbur et al. | |
| 2010/0028777 A1 | 2/2010 | Ueda et al. | |
| 2010/0035093 A1 | 2/2010 | Ruoff et al. | |
| 2010/0055025 A1 | 3/2010 | Jang et al. | |
| 2010/0081057 A1 | 4/2010 | Liu et al. | |
| 2010/0105834 A1 | 4/2010 | Tour et al. | |
| 2010/0143798 A1 | 6/2010 | Zhamu et al. | |
| 2010/0163790 A1 | 7/2010 | Ceder et al. | |
| 2010/0176337 A1 | 7/2010 | Zhamu et al. | |
| 2010/0202951 A1 | 8/2010 | Wu et al. | |
| 2010/0227221 A1 | 9/2010 | Chang et al. | |
| 2010/0233538 A1 | 9/2010 | Nesper et al. | |
| 2010/0233546 A1 | 9/2010 | Nesper et al. | |
| 2010/0248034 A1 | 9/2010 | Oki et al. | |
| 2010/0279117 A1 | 11/2010 | Gu | |
| 2010/0301279 A1 | 12/2010 | Nesper et al. | |
| 2010/0303706 A1 | 12/2010 | Wallace et al. | |
| 2010/0308277 A1 | 12/2010 | Grupp | |
| 2010/0330421 A1 | 12/2010 | Cui et al. | |
| 2011/0012067 A1 | 1/2011 | Kay | |
| 2011/0020706 A1 | 1/2011 | Nesper | |
| 2011/0031105 A1 | 2/2011 | Miyanaga | |
| 2011/0065004 A1 | 3/2011 | Murakami et al. | |
| 2011/0111303 A1 | 5/2011 | Kung et al. | |
| 2011/0121240 A1 | 5/2011 | Amine et al. | |
| 2011/0136019 A1 | 6/2011 | Amiruddin et al. | |
| 2011/0159372 A1 | 6/2011 | Zhamu et al. | |
| 2011/0195310 A1 | 8/2011 | Kawamoto et al. | |
| 2011/0223482 A1 | 9/2011 | Fujii et al. | |
| 2011/0227000 A1 | 9/2011 | Ruoff et al. | |
| 2011/0229795 A1 | 9/2011 | Niu et al. | |
| 2011/0274975 A1 | 11/2011 | Kashiwa et al. | |
| 2011/0311868 A1 | 12/2011 | Sano et al. | |
| 2012/0028122 A1 | 2/2012 | Kohmoto et al. | |
| 2012/0045692 A1 | 2/2012 | Takemura et al. | |
| 2012/0058397 A1 | 3/2012 | Zhamu et al. | |
| 2012/0064409 A1 | 3/2012 | Zhamu et al. | |
| 2012/0088151 A1 | 4/2012 | Yamazaki et al. | |
| 2012/0088156 A1 | 4/2012 | Nomoto et al. | |
| 2012/0088157 A1 | 4/2012 | Kawakami | |
| 2012/0100402 A1 | 4/2012 | Nesper et al. | |
| 2012/0237426 A1 | 9/2012 | Futamura | |
| 2012/0308884 A1 | 12/2012 | Oguni et al. | |
| 2012/0308891 A1 | 12/2012 | Todoriki et al. | |
| 2012/0315550 A1 | 12/2012 | Liu et al. | |
| 2013/0047422 A1 | 2/2013 | Miwa et al. | |
| 2013/0084384 A1 | 4/2013 | Yamakaji | |
| 2013/0266859 A1 | 10/2013 | Todoriki et al. | |
| 2013/0266869 A1 | 10/2013 | Todoriki et al. | |
| 2014/0087258 A1 | 3/2014 | Kabe et al. | |

FOREIGN PATENT DOCUMENTS

| | | |
|---|---|---|
| CN | 101142138 A | 3/2008 |
| CN | 101174682 A | 5/2008 |
| CN | 101443273 A | 5/2009 |
| CN | 101562248 A | 10/2009 |
| CN | 101710619 A | 5/2010 |
| CN | 101752561 A | 6/2010 |
| CN | 101800310 A | 8/2010 |
| CN | 101944593 A | 1/2011 |
| CN | 101999187 A | 3/2011 |
| CN | 102148371 A | 8/2011 |
| CN | 102244264 A | 11/2011 |
| CN | 102315450 A | 1/2012 |
| EP | 2270903 A | 1/2011 |
| EP | 2357693 A | 8/2011 |
| EP | 2448044 A | 5/2012 |
| EP | 2511973 A | 10/2012 |
| JP | 04-006072 B | 2/1992 |
| JP | 08-037007 A | 2/1996 |
| JP | 11-025983 A | 1/1999 |
| JP | 2002-110162 A | 4/2002 |
| JP | 2003-238131 A | 8/2003 |
| JP | 2004-079276 A | 3/2004 |
| JP | 2004-095385 A | 3/2004 |
| JP | 2006-252945 A | 9/2006 |
| JP | 2006-265751 A | 10/2006 |
| JP | 2007-035295 A | 2/2007 |
| JP | 2007-103339 A | 4/2007 |
| JP | 2007-511458 | 5/2007 |
| JP | 2009-524567 | 7/2009 |
| JP | 2009-176721 A | 8/2009 |
| JP | 2009-266813 A | 11/2009 |
| JP | 2010-040272 A | 2/2010 |
| JP | 2010-135305 A | 6/2010 |
| JP | 2010-232030 A | 10/2010 |
| JP | 2011-503804 | 1/2011 |
| JP | 2011-048992 A | 3/2011 |
| JP | 2011-071018 A | 4/2011 |
| JP | 2011-075934 A | 4/2011 |
| JP | 2011-517053 | 5/2011 |
| JP | 2011-121801 A | 6/2011 |
| JP | 2011-121802 A | 6/2011 |
| JP | 2011-146284 A | 7/2011 |
| JP | 2011-157638 A | 8/2011 |
| JP | 2011-159388 A | 8/2011 |
| JP | 4767798 | 9/2011 |
| JP | 2013-504858 | 2/2013 |
| JP | 2013-063898 A | 4/2013 |
| JP | 2017-088495 A | 5/2017 |
| WO | WO-2005/051840 | 6/2005 |
| WO | WO-2006/027925 | 3/2006 |
| WO | WO-2006/062947 | 6/2006 |
| WO | WO-2006/071076 | 7/2006 |
| WO | WO-2007/061945 | 5/2007 |
| WO | WO-2007/094644 | 8/2007 |
| WO | WO-2008/077447 | 7/2008 |
| WO | WO-2009/061685 | 5/2009 |
| WO | WO-2009/127901 | 10/2009 |
| WO | WO-2009/131095 | 10/2009 |
| WO | WO-2009/144600 | 12/2009 |
| WO | WO-2010/053174 | 5/2010 |
| WO | WO-2010/082402 | 7/2010 |
| WO | WO-2010/150686 | 12/2010 |
| WO | WO-2011/086457 | 7/2011 |
| WO | WO-2011/141486 | 11/2011 |

(56) References Cited

FOREIGN PATENT DOCUMENTS

WO  WO-2012/147766  11/2012
WO  WO-2013/031995  3/2013

OTHER PUBLICATIONS

Tannai.H et al., "Optimization of Hydrothermal Synthesis Process and Evaluation of LiFePO4 Cathode for Rechargable Lithium Batteries", The 48th Battery Symposium in Japan, Nov. 13, 2007, pp. 66-67.
Dokko.K et al., "Electrochemical properties of LiFePO4 prepared via hydrothermal route", Journal of Power Sources, Mar. 20, 2007, vol. 165, No. 2, pp. 656-659.
Kuwahara.A et al., "Hydrothermal synthesis of LiFePO4 with small particle size and its electrochemical properties", Journal of Electroceramics, 2010, vol. 24, pp. 69-75.
International Search Report (Application No. PCT/JP2012/072280) dated Dec. 4, 2012.
Written Opinion (Application No. PCT/JP2012/072280) dated Dec. 4, 2012.
Zhou.X et al., "Graphene modified LiFePO4 cathode materials for high power lithium ion batteries", J. Mater. Chem. (Journal of Materials Chemistry), 2011, vol. 21, pp. 3353-3358.
Su.F et al., "Flexible and planar graphene conductive additives for lithium-ion batteries", J. Mater. Chem. (Journal of Materials Chemistry), 2010, vol. 20, pp. 9644-9650.
Yu.G et al., "Solution-Processed Graphene/MnO2 Nanostructured Textiles for High-Performance Electrochemical Capacitors", Nano Letters, 2011, vol. 11, No. 7, pp. 2905-2911.
Kumar.A et al., "Structural and Electrochemical Characterization of Pure LiFePO4 and Nanocomposite C-LiFePO4 Cathodes for Lithium Ion Rechargeable Batteries", Journal of Nanotechnology, 2009, vol. 2009, pp. 1-10.
Notification (Japanese Application No. 2012-188157) Dated Aug. 25, 2015.
Information Offer Form (Japanese Application No. 2012-188157) Dated Aug. 17, 2015.
Taiwanese Office Action (Application No. 101130267) dated Apr. 21, 2016.
Notification (Japanese Application No. 2012-188157) Dated Nov. 8, 2016.
Information Offer Form (Japanese Application No. 2012-188157) Dated Oct. 26, 2016.
Padhi.A et al., "Phospho-olivines as Positive-Electrode Materials for Rechargeable Lithium Batteries", J. Electrochem. Soc. (Journal of the Electrochemical Society), Apr. 1, 1997, vol. 144, No. 4, pp. 1188-1194.
Paek.S et al., "Enhanced Cyclic Performance and Lithium Storage Capacity of SnO2/Graphene Nanoporous Electrodes with Three-Dimensionally Delaminated Flexible Structure", Nano Letters, 2009, vol. 9, No. 1, pp. 72-75.
Wang.G et al., "Sn/graphene nanocomposite with 3D architecture for enhanced reversible lithium storage in lithium ion batteries", J. Mater. Chem. (Journal of Materials Chemistry), 2009, vol. 19, No. 44, pp. 8378-8384.
Wang.D et al., "Self-Assembled TiO2-Graphene Hybrid Nanostructures for Enhanced Li-Ion Insertion", ACS Nano, 2009, vol. 3, No. 4, pp. 907-914.
Todoriki.H et al., "High performance lithium ion battery using Graphene Net electrode", 222nd ECS Meeting Abstract, Oct. 7, 2012, p. 1014, ECS.
Dreyer.D et al., "The Chemistry of Graphene Oxide", Chemical Society Reviews, Nov. 3, 2009, vol. 39, No. 1, pp. 228-240.
Sundaram.R et al., "Electrochemical Modification of Graphene", Adv. Mater. (Advanced Materials), Jul. 7, 2008, vol. 20, No. 16, pp. 3050-3053.
Mattevi.C et al., "Evolution of electrical, chemical, and structural properties of transparent and conducting chemically derived graphene thin films", Adv. Funct. Mater. (Advanced Functional Materials), Jun. 8, 2009, vol. 19, No. 16, pp. 2577-2583.
Zhang.H et al., "Vacuum-assisted synthesis of graphene from thermal exfoliation and reduction of graphite oxide", J. Mater. Chem. (Journal of Materials Chemistry), Apr. 14, 2011, vol. 21, No. 14, pp. 5392-5397.
Zhou.M et al., "Controlled Synthesis of Large-Area and Patterned Electrochemically Reduced Graphene Oxide Films", Chemistry a European Journal, May 14, 2009, vol. 15, No. 25, pp. 6116-6120.
Wang.Z et al., "Direct Electrochemical Reduction of Single-Layer Graphene Oxide and Subsequent Functionalization with Glucose Oxidase", J. Phys. Chem. C (The Journal of Physical Chemistry C), 2009, vol. 113, No. 32, pp. 14071-14075.
Park.S et al., "Hydrazine-reduction of graphite-and graphene oxide", Carbon, Mar. 15, 2011, vol. 49, No. 9, pp. 3019-3023, Elsevier.
Shao.Y et al., "Facile and controllable electrochemical reduction of graphene oxide and its applications", J. Mater. Chem. (Journal of Materials Chemistry), 2010, vol. 20, No. 4, pp. 743-748.
Feng.H et al., "Strong reduced graphene oxide-polymer composites:hydrogels and wires", RSC Advances, 2012, vol. 17, No. 2, pp. 6988-6993.
Pei.S et al., "The reduction of graphene oxide", Carbon, 2012, vol. 50, No. 9, pp. 3210-3228, Elsevier.
Taiwanese Office Action (Application No. 106102957) dated Aug. 29, 2017.

* cited by examiner

METHOD FOR MAKING LIFEPO₄ BY HYDROTHERMAL METHOD

TECHNICAL FIELD

The present invention relates to a composite oxide and further relates to a power storage device.

BACKGROUND ART

In recent years, power storage devices such as lithium ion secondary batteries have been developed.

Examples of such power storage devices include a power storage device having an electrode formed using lithium iron phosphate ($LiFePO_4$), which is a composite oxide, as an active material. The power storage device having an electrode formed using $LiFePO_4$ has high thermal stability and favorable cycle characteristics.

As an example of a method for forming a composite oxide such as $LiFePO_4$, a hydrothermal method can be used (e.g., Patent Document 1). A hydrothermal method is a method, which is performed in the presence of hot water, for synthesizing a compound or growing crystal of a compound.

By using a hydrothermal method, even a material which is less likely to be dissolved in water at ordinary temperatures and pressures can be dissolved, and thus a substance which is hardly obtained by a production method performed at ordinary temperatures and pressures can be synthesized or crystal growth of such a substance can be conducted. Further, by using a hydrothermal method, microparticles of single crystals of an objective substance can be easily synthesized.

Using a hydrothermal method, for example, enables a desired compound to be formed in the following manner: a solution containing a raw material is introduced into a container resistant to pressure and be subjected to heat and pressure treatment; and the treated solution is filtered.

REFERENCE

[Patent Document 1] Japanese Published Patent Application No. 2004-095385

DISCLOSURE OF INVENTION

However, $LiFePO_4$ formed by the conventional hydrothermal method has a problem of large variation in crystal shape of $LiFePO_4$.

When variation in crystal shape is large, for example, the bulk density of crystals in an active material of an electrode is low, and the charge-discharge characteristics of a power storage device are reduced. In order to suppress a reduction in the charge-discharge characteristics of the power storage device, crystal shapes are preferably regulated, so that the crystal shapes in the active material of the electrode are uniform.

An object of one embodiment of the present invention is to reduce variation in shape of crystals formed by using a hydrothermal method.

In one embodiment of the present invention, a mixture solution containing a raw material is made in an environment where an oxygen concentration is lower than that in air, and with use of the mixture solution, a composite oxide is formed by using a hydrothermal method, whereby difference in crystal shape in the formed composite oxide is suppressed.

One embodiment of the present invention is a production method of a composite oxide including the steps of: forming a solution containing lithium (Li) with use of a compound containing Li in an atmosphere where an oxygen concentration is lower than that in air; forming a solution containing phosphorus (P) with use of a compound containing P in an atmosphere where an oxygen concentration is lower than that in air; forming a solution containing one or more transition metals selected from iron (Fe), cobalt (Co), nickel (Ni), and manganese (Mn) with use of one or more compounds containing any one transition metal of Fe, Co, Ni, and Mn in an atmosphere where an oxygen concentration is lower than that in air; mixing the solution containing Li and the solution containing P in an atmosphere where an oxygen concentration is lower than that in air and forming a solution containing Li and P; mixing the solution containing Li and P and the solution containing the transition metal in an atmosphere where an oxygen concentration is lower than that in air and forming a mixture solution; and forming a composite oxide by a hydrothermal method in an atmosphere where an oxygen concentration is lower than that in air. The thus obtained composite oxide is represented by a general formula, $LiMPO_4$ (M denotes one or more of Fe, Co, Ni, and Mn).

According to one embodiment of the present invention, shapes of formed crystals can be regulated. Thus, difference in crystal shape can be reduced.

BEST MODE FOR CARRYING OUT THE INVENTION

Examples of embodiments of the present invention will be described with reference to the drawings below. Note that it will be readily appreciated by those skilled in the art that details of the embodiments can be modified in various ways without departing from the spirit and scope of the invention. Thus, the present invention should not be limited to the description of the following embodiments.

Note that the contents in different embodiments can be combined with one another as appropriate. In addition, the contents of the embodiments can be replaced with each other as appropriate.

Further, the ordinal numbers such as "first" and "second" are used to avoid confusion between components and do not limit the number of each component.

Embodiment 1

In this embodiment, an example of a composite oxide having crystals will be described.

An example of a production method of a composite oxide of this embodiment is described with reference to flow charts in FIGS. 1A and 1B.

Figure 1A:
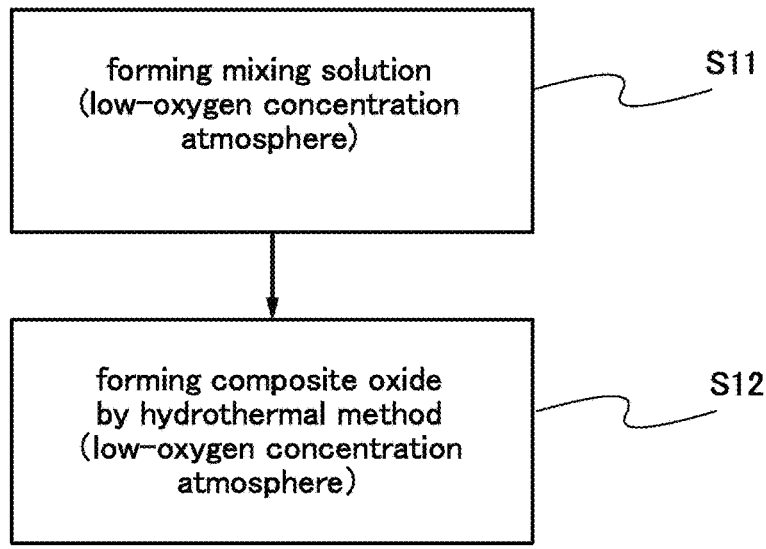
FIGS. 1A and 1B are flow charts showing an example of a production method of a composite oxide.

In the example of a production method of a composite oxide in this embodiment, as shown in FIG. 1A, a mixture solution used for synthesizing a composite oxide is formed in an atmosphere where an oxygen concentration is lower than that in air (the atmosphere is also referred to as "low-oxygen concentration atmosphere") as a step S11. Then, a composite oxide is formed with use of the obtained mixture solution by a hydrothermal method as a step S12.

Figure 1B:
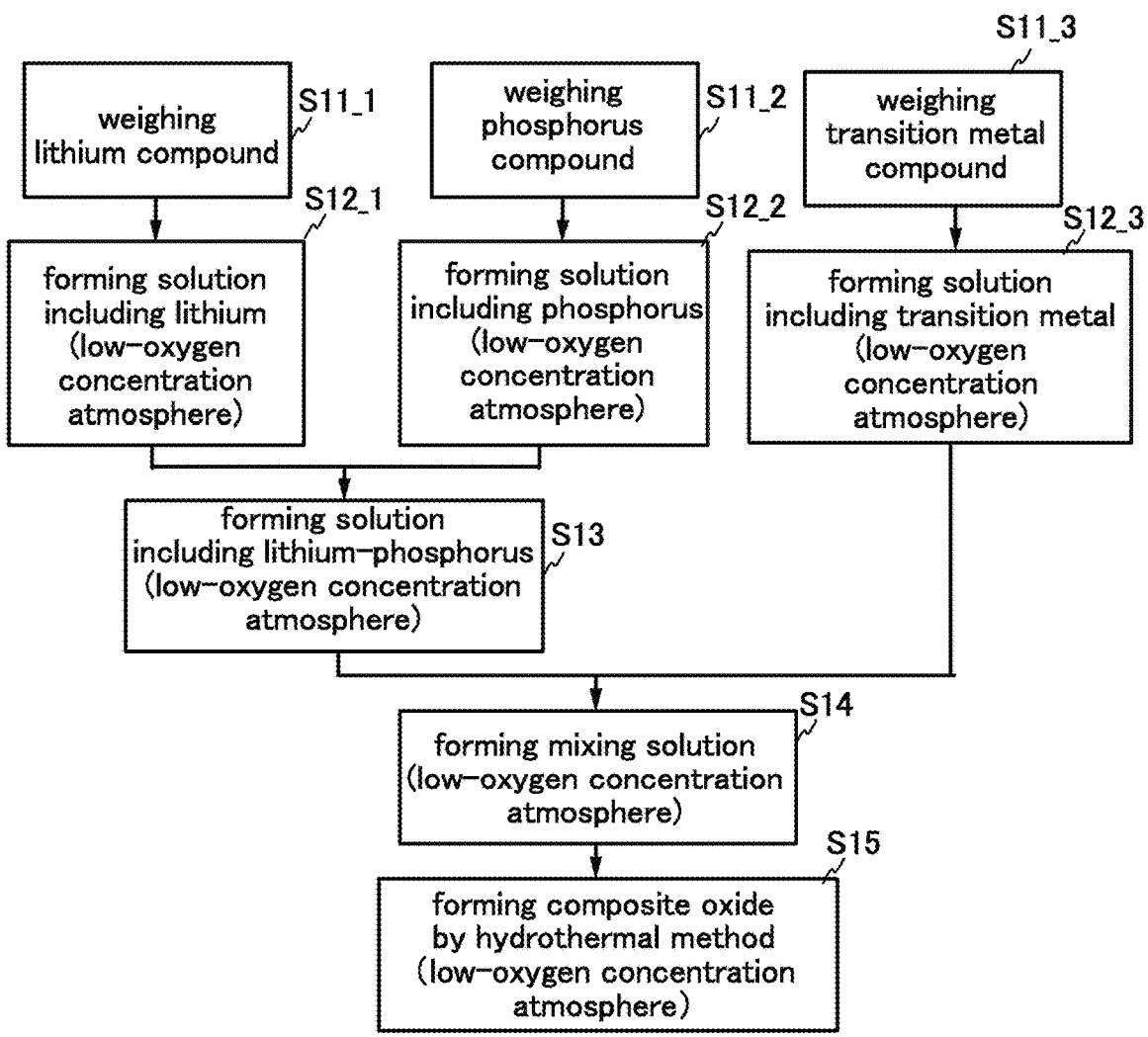

Details of the production method of a composite oxide is described with a flow chart shown in FIG. 1B.

In the example of a production method of a composite oxide of this embodiment, as shown in FIG. 1B, a compound containing lithium (Li), which is also referred to as "lithium compound", is weighed as a step S11_1. Further, a compound containing phosphorus (P), which is also referred to as "phosphorus compound", is weighed as a step S11_2. Further, a compound containing a transition metal, which is also referred to as "transition metal compound", is weighed as a step S11_3.

Examples of lithium compounds that can be used include lithium hydroxide monohydrate ($LiOH \cdot H_2O$), anhydrous lithium hydroxide (LiOH), lithium carbonate ($Li_2CO_3$), lithium oxide ($Li_2O$), lithium nitrate ($LiNO_3$), and lithium acetate ($CH_3COOLi$).

Examples of phosphorus compounds that can be used include phosphoric acid such as orthophosphoric acid ($H_3PO_4$) and ammonium hydrogenphosphates such as ammonium dihydrogenphosphate ($NH_4H_2PO_4$).

As a transition metal compound, for example, one or more compounds containing any one of iron (Fe), cobalt (Co), nickel (Ni), and manganese (Mn) can be used. Examples thereof include iron chloride tetrahydrate ($FeCl_2 \cdot 4H_2O$), iron sulfate heptahydrate ($FeSO_419\ 7H_2O$), iron acetate ($Fe(CH_3COO)_2$), manganese chloride tetrahydrate ($MnCl_2 \cdot 4H_2O$), manganese sulfate-hydrate ($MnSO_4 \cdot H_2O$), manganese acetate tetrahydrate ($Mn(CH_3COO)_2 \cdot 4H_2O$), cobalt chloride hexahydrate ($CoCl_2 \cdot 6H_2O$), cobalt sulfate ($CoSO_4$), cobalt acetate tetrahydrate ($Co(CH_3COO)_2 \cdot 4H_2O$), nickel chloride hexahydrate ($NiCl_2 \cdot 6H_2O$), nickel sulfate hexahydrate ($NiSO_4 \cdot 6H_2O$), and nickel acetate tetrahydrate ($Ni(CH_3COO)_2 \cdot 4H_2O$).

Then, as a step S12_1, the lithium compound is dissolved in a solvent in an atmosphere where an oxygen concentration is lower than that in air, so that a solution containing Li (also referred to as "lithium containing solution") is formed. Further, as a step S12_2, the phosphorus compound is dissolved in a solvent in an atmosphere where an oxygen concentration is lower than that in air, so that a solution containing P (also referred to as "phosphorus containing solution") is formed. Further, as a step S12_3, the transition metal compound is dissolved in a solvent in an atmosphere where an oxygen concentration is lower than that in air, so that a solution containing a transition metal (also referred to as "transition metal-containing solution") is formed.

As the solvent in which the lithium compound, the phosphorus compound, or the transition metal compound is dissolved, water can be used for example. In addition, the oxygen concentration in the solvent is preferably 4.5 ppm or lower. For example, nitrogen bubbling is performed in the solvent, whereby the oxygen concentration in the solvent can be reduced. Reduction in the oxygen concentration in the solvent enables suppression of oxidation of a substance which is to be produced.

Further, as the atmosphere where an oxygen concentration is lower than that in air, for example, a nitrogen atmosphere or a mixed atmosphere of nitrogen and hydrogen can be employed.

Next, as a step S13, the solution containing Li and the solution containing P are mixed in an atmosphere where an oxygen concentration is lower than that in air, so that a solution containing Li and P (also referred to as "lithium-phosphorus-containing solution") is formed. The solution containing Li and P is slightly alkaline.

Then, as a step S14, the solution containing Li and P and the solution containing the transition metal are mixed in an atmosphere where an oxygen concentration is lower than that in air, so that a mixture solution is formed.

In this step, it is preferable, for example, to drip the solution containing Li and P little by little while stirring the solution containing the transition metal. Thus, a hydrogen ion in the solution containing the transition metal and a hydroxide ion in the solution containing Li and P are reacted (neutralization reaction) prior to a reaction of a transition metal ion and a hydroxide ion. As a result, production of unnecessary transition metal hydroxide can be reduced.

Then, as a step S15, a composite oxide is formed using the mixture solution by a hydrothermal method.

For example, the mixture solution is introduced into a container resistant to pressure, subjected to pressure and heat treatment, and cooled. Then, the cooled solution is filtered. In this manner, the composite oxide can be formed.

As a container resistant to pressure, an autoclave or the like can be used, for example.

A preferable temperature at which the pressure and heat treatment is performed is, for example, higher than or equal to 100° C. and lower than or equal to the critical temperature of water. A preferable pressure at which the pressure and heat treatment is performed is, for example, higher than or equal to 0.1 MPa and lower than or equal to the critical pressure of water. A preferable time during which the pressure and heat treatment is performed is, for example, 0.5 hours or longer. In addition, the atmosphere in the container resistant to pressure is set to have lower oxygen concentration than that in air, whereby the treatment can be performed by a hydrothermal method in an atmosphere where an oxygen concentration is lower than that in air. For example, the preferable atmosphere in the container resistant to pressure is a nitrogen atmosphere or a mixed atmosphere of nitrogen and hydrogen. Thus, unnecessary oxygen in the container resistant to pressure can be removed. Further, even when the solution is oxidized during the step, the solution can be reduced. Therefore, adverse effect of oxidation can be suppressed.

Alternatively, the pressure and heat treatment may be performed after addition of a reducing agent. For example, a reducing agent is added to the mixture solution, and then the pressure and heat treatment can be performed. Further, without limitation thereto, for example, a reducing agent may be added to the solution containing the transition metal, and then the mixture solution may be formed.

Examples of a reducing agent include ascorbic acid, sulfur dioxide, sulfurous acid, sodium sulfite, sodium hydrogen sulfite, ammonium sulfite, and phosphorous acid. With use of a reducing agent, the solution can be reduced even when the solution is oxidized during the step; thus, adverse effect of oxidation can be reduced.

Figure 2:
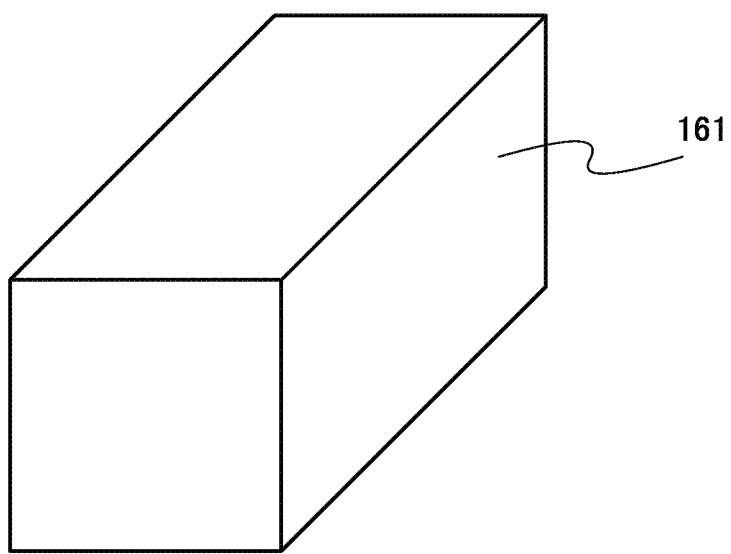
FIG. 2 is a schematic view illustrating an example of a crystal structure of a composite oxide.

The composite oxide obtained by a hydrothermal method has a plurality of crystals. The crystal shape of the composite oxide is, for example, a rectangular solid 161 as illustrated in FIG. 2. Variation in shapes of the plurality of crystals, which are rectangular solids, is small. This is because impurities in the composite oxide formed under the condition where oxidation is suppressed are reduced. Note that it is preferable that a crystal structure of the composite oxide be an olivine structure.

The foregoing has described an example of a production method of a composite oxide according to this embodiment.

As described with reference to FIGS. 1A and 1B and FIG. 2, according to the example of a production method of a composite oxide of this embodiment, a solution containing lithium (Li) and phosphorus (P) is formed by mixing a solution containing Li and a solution containing P in an atmosphere where an oxygen concentration is lower than that in air, and then a mixture solution is formed by mixing the solution containing Li and P and a solution containing a transition metal in an atmosphere where an oxygen concentration is lower than that in air, so that generation of by-product due to oxidation can be suppressed. Thus, variation in crystal shape of composite oxide formed by using a hydrothermal method can be small.

Embodiment 2

In this embodiment, an example of a power storage device having an electrode in which the composite oxide described in Embodiment 1 is used for an active material will be described.

A structure example of a power storage device in this embodiment is described with reference to FIG. 3.

Figure 3:
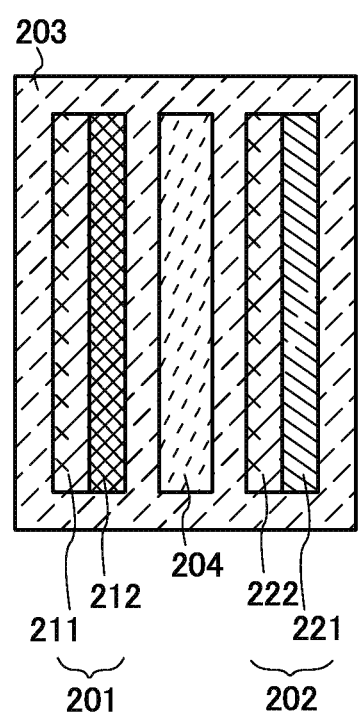
FIG. 3 illustrates an example of a power storage device.

The power storage device illustrated in FIG. 3 includes a positive electrode 201, a negative electrode 202, an electrolyte 203, and a separator 204.

The positive electrode 201 includes a positive electrode current collector 211 and a positive electrode active material layer 212.

For the positive electrode current collector 211, aluminum, copper, nickel, titanium, or the like can be used. Further, an alloy including a plurality of materials capable of being used for the positive electrode current collector 211 may be used.

For the positive electrode active material layer 212, for example, the composite oxide described in Embodiment 1 can be used. In this case, the composite oxide can be formed, for example, by the production method described in Embodiment 1. The composite oxide functions as an active material.

For example, a conduction auxiliary agent, a binder, and a solvent are added to the composite oxide described in Embodiment 1, whereby a paste is formed. The paste is applied on the positive electrode current collector 211 and baked, so that the positive electrode active material layer 212 can be formed.

The negative electrode 202 includes a negative electrode current collector 221 and a negative electrode active material layer 222.

For the negative electrode current collector 221, iron, copper, nickel, or the like can be used. Alternatively, for the negative electrode current collector 221, an alloy of a plurality of materials capable of being used for the negative electrode current collector 221 may be used.

For the negative electrode active material layer 222, silicon, graphite, or the like can be used. In this case, silicon or graphite functions as an active material.

Further, the negative electrode active material layer 222 may have a structure including a plurality of whiskers, for example.

Further, for the negative electrode active material layer 222, graphene can be used for example.

Graphene refers to a one-atom-thick sheet of carbon molecules having $sp^2$ bonds and holes through which ions pass, or refers to a stack in which a plurality of one-atom-thick sheets (the number of sheets is 2 to 100) are stacked (the stack is also referred to as multilayer graphene). Further, net-like graphene is referred to as graphene net. Note that in graphene, an element other than carbon may be contained to account for 30 at. % or less, or an element other than carbon and hydrogen may be contained to account for 15 at. % or less. Thus, graphene analogue is also regarded as graphene.

Characteristics of graphene are high conductivity, sufficient flexibility, high mechanical strength and high heat resistance. In addition, graphene has capacity of storing ions.

In the case where silicon or graphite is used for an active material, for example, silicon or graphite may be covered with graphene. Further, in the case of multilayer graphene, for example, microparticles of silicon, graphite, or the like may be included between a plurality of graphene layers.

By using graphene, conductivity of an electrode can be increased. Accordingly, graphene can have a function of a binder. Further, by using graphene, an electrode can be formed without a conventional conductive auxiliary agent or a binder.

Furthermore, by using graphene, deformation and damage of the electrode can be suppressed.

Note that graphene may be used not only for the negative electrode active material layer 222 but also for the positive electrode active material layer 212. For example, a plurality of crystals of the composite oxide described in Embodiment 1 may be covered with graphene. Further, in the case of multilayer graphene, for example, microparticles of the composite oxide may be provided between a plurality of graphene layers.

Figure 4A:
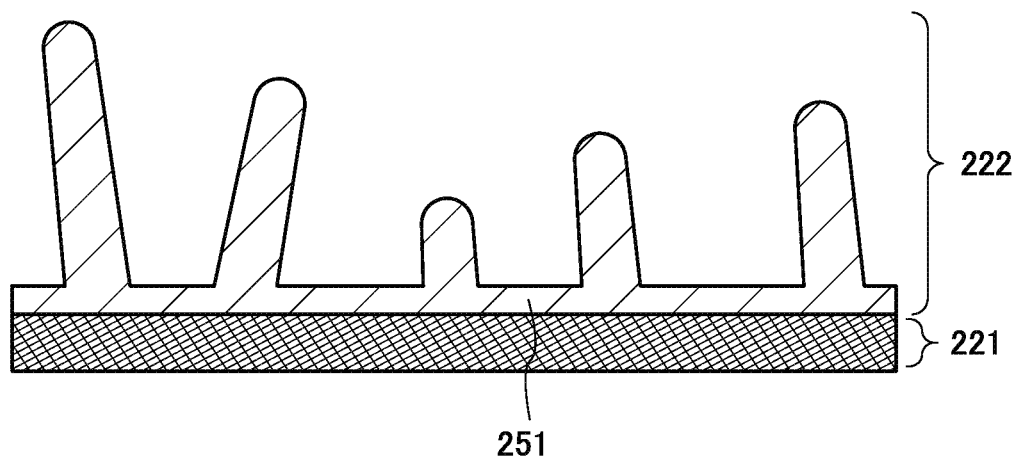
FIGS. 4A and 4B each illustrate a structure example of an electrode in a power storage device.

FIG. 4A illustrates a structure example of the negative electrode 202 including the negative electrode active material layer 222. In this example, the negative electrode active material layer 222 has a plurality of whiskers.

The electrode illustrated in FIG. 4A includes the negative electrode current collector 221 and the negative electrode active material layer 222. The negative electrode active material layer 222 includes a layer 251 having whiskers.

As the layer 251 having whiskers, for example, silicon can be used.

In the layer 251 having whiskers, it is preferable that a core portion of each whiskers have crystallinity (the core portion is also referred to as crystalline portion) and the peripheral portion of the core portion be amorphous. For example, in the amorphous portion, change in volume, which occurs due to store and release of ions, is small. The crystalline portion has high conductivity and high ion conductivity; thus, in the crystalline portion, the rate of storing ions and the rate of releasing ions can be increased.

The layer 251 having whiskers can be formed by, for example, a low pressure CVD (LPCVD) method.

For example, in the case where the layer 251 having whiskers is formed using silicon, a deposition gas containing silicon can be used as a source gas for forming the layer 251 having whiskers by an LPCVD method. For the deposition gas containing silicon, silicon hydride, silicon fluoride, or silicon chloride can be used for example.

The pressure is preferably set to 10 Pa to 1000 Pa inclusive, further preferably 20 Pa to 200 Pa inclusive. By adjusting pressure, the crystalline portion and the amorphous portion can be each formed.

Figure 4B:
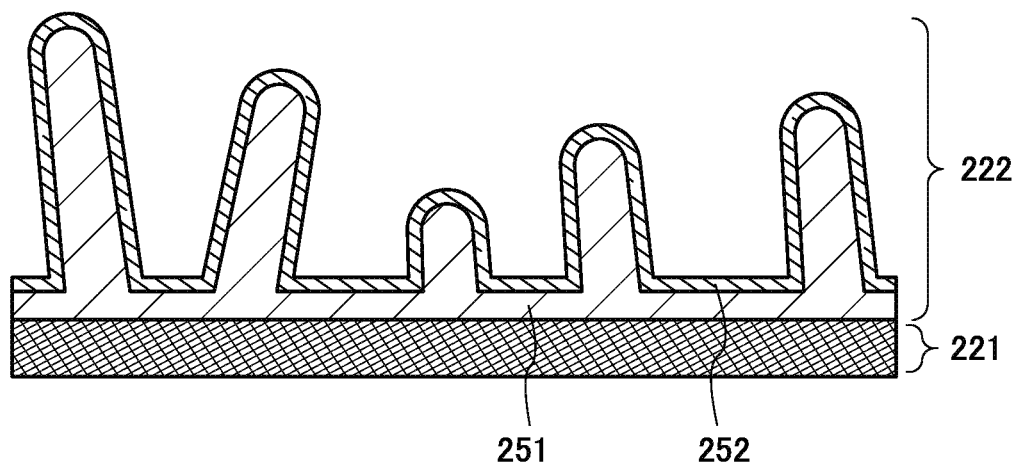

Alternatively, the negative electrode active material layer 222 can have such a structure that a layer having graphene is provided to cover the layer 251 having whiskers. FIG. 4B illustrates a structure example of the negative electrode 202 including the negative electrode active material layer 222 in which a layer having graphene is provided to cover the layer having whiskers.

The electrode illustrated in FIG. 4B includes a layer 252 having graphene in addition to the structure illustrated in FIG. 4A.

The layer 252 having graphene is provided in contact with the layer 251 having whiskers.

For example, the layer 252 having graphene can be formed in the following manner: a graphene oxide layer is formed over the layer 251 having whiskers and then heated, so that the graphene oxide layer is reduced.

As an example illustrated in FIG. 4B, the negative electrode active material layer has a structure in which a layer having graphene is provided in contact with the layer having whiskers, whereby even when the volume of the layer having whiskers is changed due to store and release of ions, for example, the layer having graphene contributes to reduce stress caused by change in volume. As a result, the whisker structure in the layer having whiskers can be prevented from being damaged. Therefore, cycle characteristics of the power storage device can be improved.

As the separator 204 illustrated in FIG. 3, for example, paper, nonwoven fabric, glass fiber, or synthetic fiber may be used. As the synthetic fiber, materials such as nylon (polyamide), vinylon (also called vinalon) (polyvinyl alcohol fiber), polyester, acrylic, polyolefin, and polyurethane may be used. More examples of materials of the separator 204 are polymer materials (high-molecular compounds) such as fluorine-based polymer, polyether (e.g., polyethylene oxide and polypropylene oxide), polyolefin (e.g., polyethylene and polypropylene), polyacrylonitrile, polyvinylidene chloride, polymethyl methacrylate, polymethylacrylate, polyvinyl alcohol, polymethacrylonitrile, polyvinyl acetate, polyvinylpyrrolidone, polyethyleneimine, polybutadiene, polystyrene, polyisoprene, and polyurethane, derivatives thereof, a cellulose based material such as paper and film, and nonwoven fabric. These materials can be used either alone or in combination. However, it is necessary to choose a material which will not dissolve in the electrolyte 203, as the separator 204.

The electrolyte 203 can be formed using a material including ions serving as carriers, a material through which ions serving as carriers transfer, or the like. Examples of such a material include lithium chloride (LiCl), lithium fluoride (LiF), lithium perchlorate ($LiClO_4$), and lithium tetrafluoroborate ($LiBF_4$). These materials can be used either alone or in combination in the electrolyte 203. Alternatively, for the electrolyte 203, a lithium salt material containing fluorine can be used, e.g., lithium hexafluorophosphate ($LiPF_6$), lithium hexafluoroarsenate ($LiAsF_6$), lithium trifluoromethansulfonate ($LiCF_3SO_3$), lithium bis(trifluoromethanesulfonyl)imide ($LiN(SO_2CF_3)_2$), lithium bis(pentafluoroethanesulfonyl)imide ($LiN(SO_2C_2F_5)_2$), or the like.

Alternatively, the electrolyte 203 can be formed by dissolving the above material into a solvent. Examples of the solvent include a cyclic carbonate such as ethylene carbonate (EC), propylene carbonate (PC), butylene carbonate (BC), and vinylene carbonate (VC); an acyclic carbonate such as dimethyl carbonate (DMC), diethyl carbonate (DEC), ethylmethyl carbonate (EMC), methylpropyl carbonate (MPC), isobutyl methyl carbonate (MPC), and dipropyl carbonate (DPC); an aliphatic carboxylic acid ester such as methyl formate, methyl acetate, methyl propionate, and ethyl propionate; a γ-lactone such as γ-butyrolactone; an acyclic ether such as 1,2-dimethoxyethane (DME), 1,2-diethoxyethane (DEE), and ethoxymethoxy ethane (EME); a cyclic ether such as tetrahydrofuran and 2-methyltetrahydrofuran; an alkyl phosphate ester such as dimethylsulfoxide, 1,3-dioxolane, trimethyl phosphate, triethyl phosphate, and trioctyl phosphate; and fluorides thereof. These materials can be used either alone or in combination as the solvent of the electrolyte 203.

As an example of a power storage device according to this embodiment, a structure example of a coin-type secondary battery is described with reference to FIG. 5.

Figure 5:
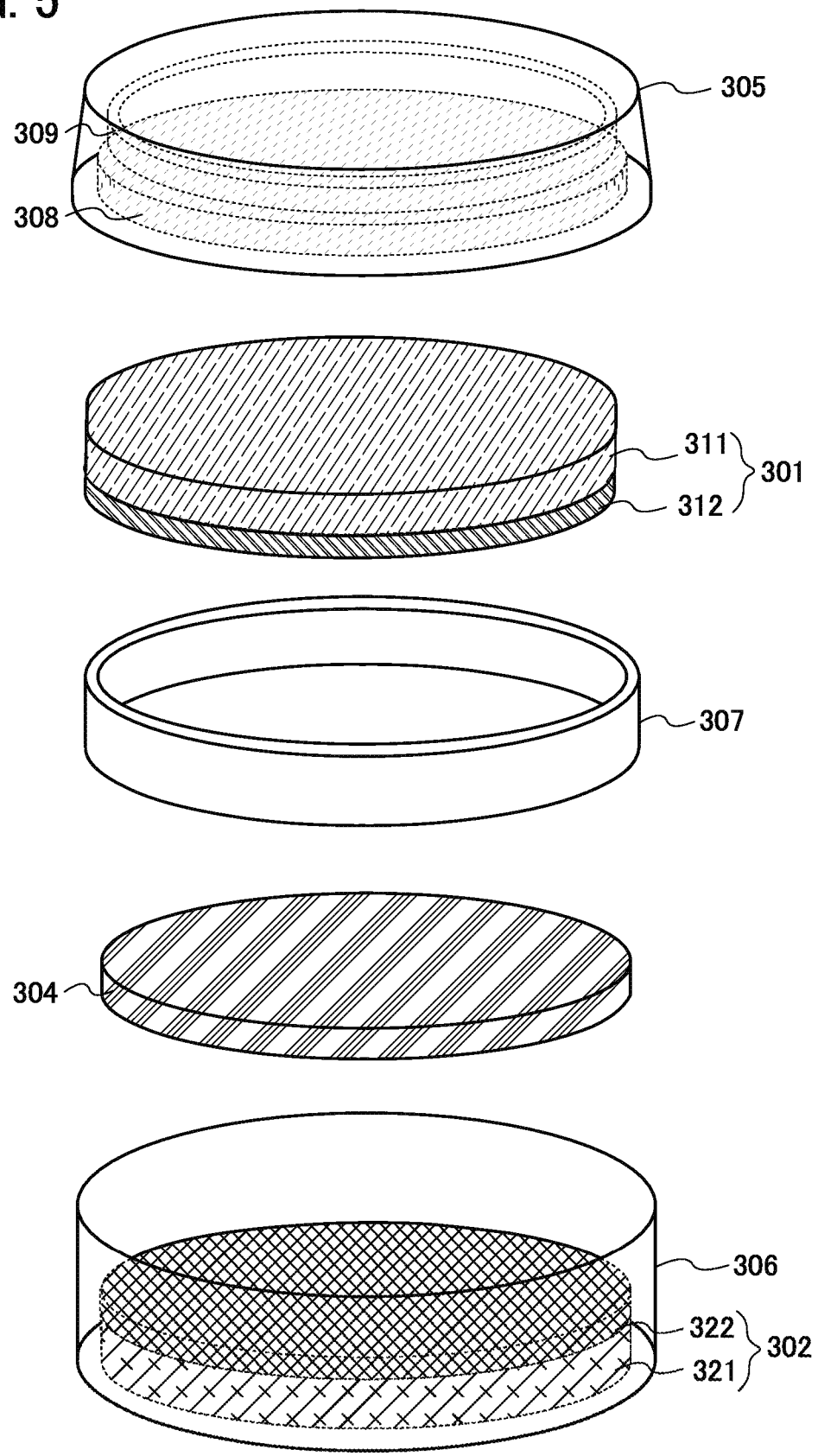
FIG. 5 illustrates an example of a power storage device.

The power storage device illustrated in FIG. 5 includes a positive electrode 301, a negative electrode 302, a separator 304, a housing 305, a housing 306, a ring-shaped insulator 307, a spacer 308, and a washer 309.

The positive electrode 301 corresponds to the positive electrode 201 in FIG. 3, for example. A positive electrode current collector 311 corresponds to the positive electrode current collector 211, and a positive electrode active material layer 312 corresponds to the positive electrode active material layer 212.

The negative electrode 302 corresponds to the negative electrode 202 in FIG. 3, for example. A negative electrode current collector 321 corresponds to the negative electrode current collector 221, and a negative electrode active material layer 322 corresponds to the negative electrode active material layer 222.

The separator 304 corresponds to the separator 204 in FIG. 3, for example.

The housing 305, the housing 306, the spacer 308, and the washer 309 each of which is made of metal (e.g., stainless steel) are preferably used. The housing 305 and the housing 306 have a function of electrically connecting the positive electrode 301 and the negative electrode 302 to the outside.

As in the case of the power storage device illustrated in FIG. 5, the positive electrode 301, the negative electrode 302, and the separator 304 are soaked in the electrolyte; the negative electrode 302, the separator 304, the ring-shaped insulator 307, the positive electrode 301, the spacer 308, the washer 309, and the housing 305 are stacked in this order with the housing 306 positioned at the bottom; and the housing 305 and the housing 306 are subjected to pressure bonding. In such a manner, the coin-type secondary battery is manufactured.

The foregoing has described an example of a power storage device according to this embodiment.

Note that not being limited to use for the above coin-type secondary battery, the composite oxide according to Embodiment 1 can be used for a rectangular or cylindrical secondary battery, for example.

As described with reference to FIG. 3, FIGS. 4A and 4B, and FIG. 5, in the example of a power storage device according to this embodiment, the positive electrode of the power storage device is formed using the composite oxide according to the above embodiment, whereby the bulk density of an active material can be increased. As a result, the energy density of the power storage device can be increased.

Embodiment 3

In this embodiment, examples of electric devices each provided with a power storage device will be described.

Examples of electric devices using the power storage device are as follows: display devices, lighting devices, desktop personal computers or notebook personal computers, image reproduction devices (for example, which reproduce a still image or a moving image stored in a storage medium such as a digital versatile disc (DVD)), mobile phones, portable game machines, portable information terminals, e-book readers, video cameras, digital still cameras, high-frequency heating apparatus such as microwaves, electric rice cookers, electric washing machines, air-conditioning systems such as air conditioners, electric refrigerators, electric freezers, electric refrigerator-freezers, freezers for preserving DNA, dialysis devices, and the like. In addition, moving objects driven by an electric motor using electric power from a power storage device are also included in the category of electric devices. As examples of the moving objects, electric vehicles, hybrid vehicles which include both an internal-combustion engine and an electric motor, motorized bicycles including motor-assisted bicycles, and the like can be given.

Examples of electric devices of this embodiment are described with reference to FIG. 6 and FIGS. 7A and 7B.

Figure 6:
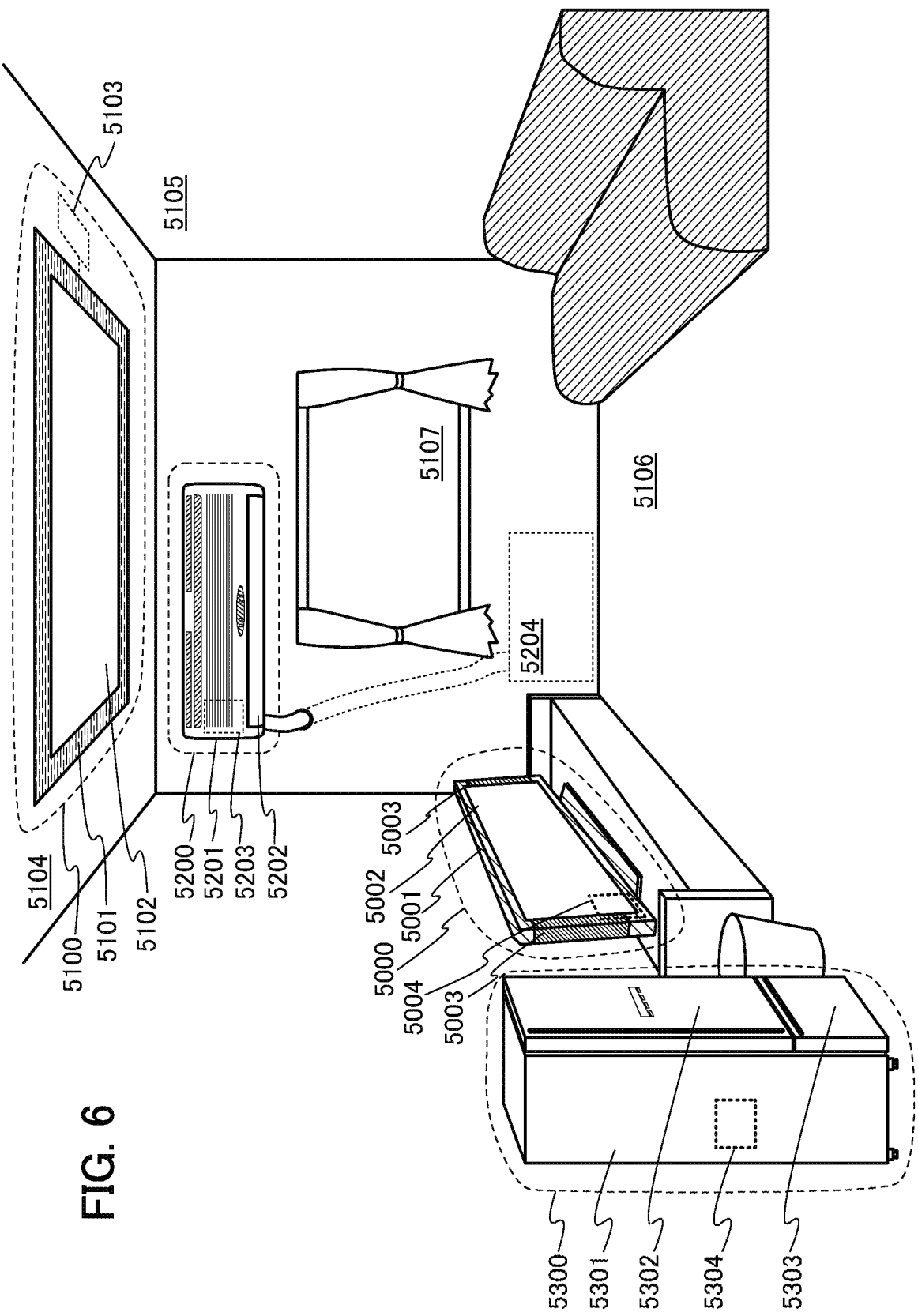
FIG. 6 illustrates examples of electric devices.

A display device 5000 shown in FIG. 6 includes a housing 5001, a display portion 5002, a speaker portion 5003, a power storage device 5004, and the like. The display device 5000 corresponds to a display device for TV broadcast reception.

Note that the display device disclosed in this specification includes, in its category, all of information display devices for personal computers, advertisement displays, and the like besides TV broadcast reception.

As the display portion 5002, a display device such as a liquid crystal display device, a light-emitting device in which a light-emitting element such as an organic EL element is provided in each pixel, an electrophoresis display device, a digital micromirror device (DMD), a plasma display panel (PDP), or a field emission display (FED) can be used, for example.

The power storage device 5004 is provided in the housing 5001. As the power storage device 5004, the power storage device described in Embodiment 2 can be used for example.

The display device 5000 can receive electric power from a commercial power supply. Alternatively, the display device 5000 can use electric power stored in the power storage device 5004. Thus, even when electric power cannot be supplied from the commercial power supply because of power outage or the like, the display device 5000 can be operated with use of the power storage device 5004 as a power supply.

A lighting device 5100 shown in FIG. 6 is an installation lighting device. The lighting device 5100 includes a housing 5101, a light source 5102, and a power storage device 5103.

As the light source 5102, an artificial light source which emits light artificially by using electric power can be used. Examples of artificial light source include discharge lamps such as an incandescent lamp and a fluorescent lamp, and light-emitting elements such as a light-emitting diode and an organic EL element.

The power storage device 5103 is provided in a ceiling 5104 on which the housing 5101 and the light source 5102 are installed. Note that the power storage device 5103 may be provided in the housing 5101, not being limited to the above case.

The lighting device 5100 can receive power from a commercial power supply. Alternatively, the lighting device 5100 can use power stored in the power storage device 5103. Thus, even when electric power cannot be supplied from the commercial power supply because of power outage or the like, the lighting device 5100 can be operated with use of the power storage device 5103 as a power supply.

Note that although the installation lighting device 5100 shown in FIG. 6 is provided in the ceiling 5104, it is not limited thereto. The power storage device can be used in an installation lighting device provided in a wall 5105, a floor 5106, a window 5107, or the like, besides in the ceiling 5104. Alternatively, the power storage device can be used in a tabletop lighting device and the like.

An air conditioner in FIG. 6 includes an indoor unit 5200 and an outdoor unit 5204.

The indoor unit 5200 includes a housing 5201, a ventilation duct 5202, the power storage device 5203, and the like. Note that although the power storage device 5203 shown in FIG. 6 is provided in the indoor unit 5200, it is not limited thereto. For example, the power storage device 5203 may be provided in the outdoor unit 5204. Alternatively, the power storage devices 5203 may be provided in both the indoor unit 5200 and the outdoor unit 5204.

The air conditioner can receive electric power from the commercial power supply. Alternatively, the air conditioner can use electric power stored in the power storage device 5203. Specifically, in the case where the power storage devices 5203 are provided in both the indoor unit 5200 and the outdoor unit 5204, the air conditioner can be operated with use of the power storage device 5203 as a power supply even when electric power cannot be supplied from the commercial power supply because of power outage or the like.

Note that although the separated air conditioner including the indoor unit and the outdoor unit is shown in FIG. 6 as an example, the power storage device may be used in an air conditioner in which the functions of an indoor unit and an outdoor unit are integrated in one housing.

An electric refrigerator-freezer 5300 shown in FIG. 6 includes a housing 5301, a door for a refrigerator 5302, a door for a freezer 5303, and the power storage device 5304.

The power storage device 5304 is provided in the housing 5301.

The electric refrigerator-freezer 5300 can receive power from a commercial power supply. Alternatively, the electric refrigerator-freezer 5300 can use power stored in the power storage device 5304. Thus, even when electric power cannot be supplied from the commercial power supply because of power outage or the like, the electric refrigerator-freezer 5300 can be operated with use of the power storage device 5304 as a power supply.

In addition, a high-frequency heating apparatus such as a microwave and an electric device such as an electric rice cooker require high power in a short time. The stop of supplying a commercial power supply in use of electric devices can be prevented by using the power storage device as an auxiliary power supply for supplying electric power which cannot be supplied enough by a commercial power supply.

In addition, in a time period when electric devices are not used, specifically when the proportion of the amount of power which is actually used to the total amount of power which can be supplied by a commercial power supply source (such a proportion referred to as usage rate of power) is low, power can be stored in the power storage device, whereby an increase in usage rate of power can be suppressed in a time period when the electric devices are used. In the case of the electric refrigerator-freezer 5300, electric power can be stored in the power storage device 5304 at night time when the temperature is low and the door for a refrigerator 5302 and the door for a freezer 5303 are not opened or closed. The power storage device 5304 is used as an auxiliary power supply in daytime when the temperature is high and the door for a refrigerator 5302 and the door for a freezer 5303 are opened and closed; thus, the usage rate of electric power in daytime can be reduced.

Figure 7A:
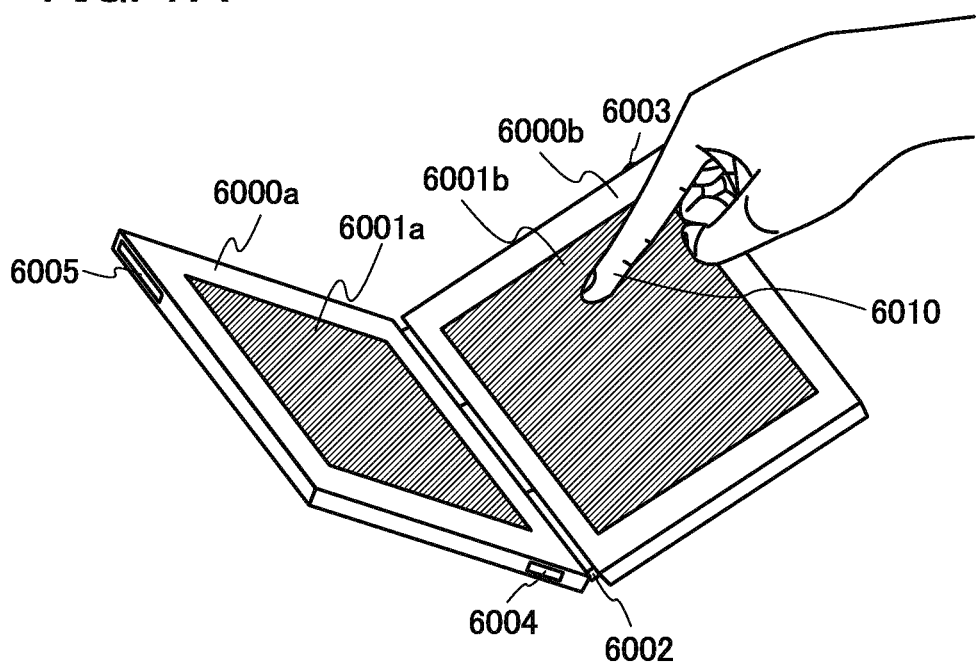
FIG. 7A is a schematic view illustrating an example of an electric device and FIG. 7B is a block diagram thereof.
Figure 7B:
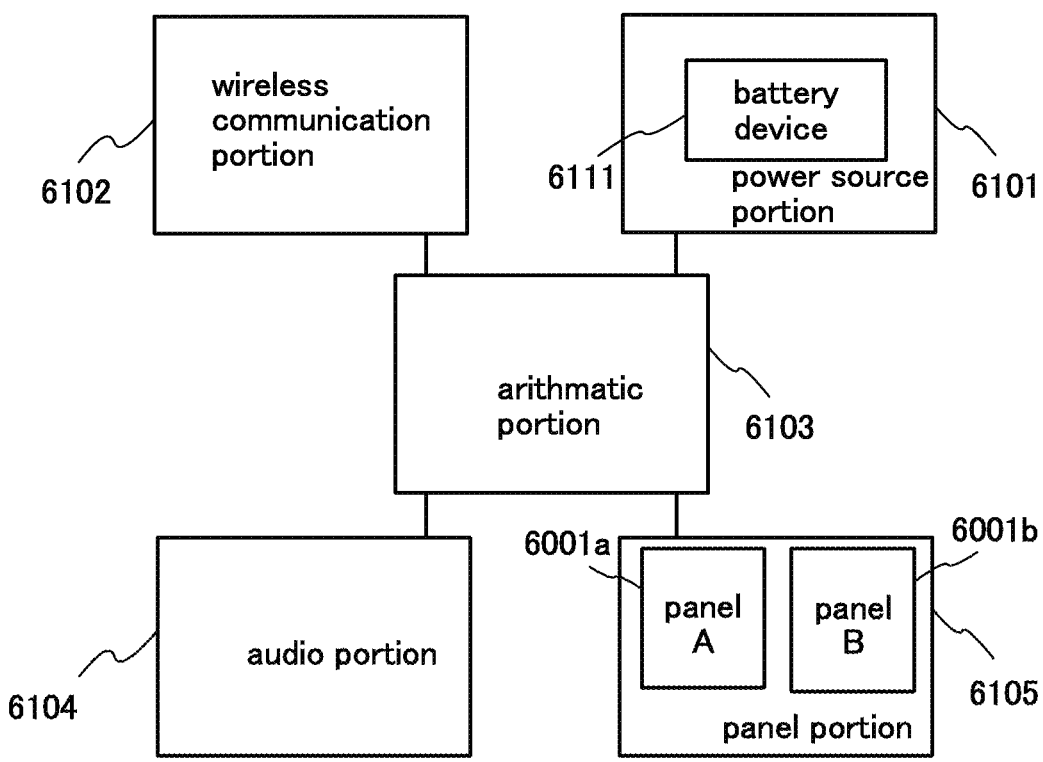

Further, the electric device illustrated in FIGS. 7A and 7B is an example of a folding mobile information terminal. FIG. 7A is a schematic external view, and FIG. 7B is a block diagram.

The electric device in FIGS. 7A and 7B includes a housing 6000a, a housing 6000b, a panel 6001a, a panel 6001b, a hinge 6002, a button 6003, a connection terminal 6004, and a storage medium insertion portion 6005, as illustrated in FIG. 7A. In addition, the electric device in FIGS. 7A and 7B has a power source portion 6101, a wireless communication portion 6102, an arithmetic portion 6103, an audio portion 6104, and a panel portion 6105, as illustrated in FIG. 7B.

The panel 6001a is provided in the housing 6000a.

The panel 6001b is provided in the housing 6000b. The housing 6000b is connected to the housing 6000a with the hinge 6002.

The panel 6001a and the panel 6001b function as display panels. For example, the panel 6001a and the panel 6001b may display different images or one image.

Further, one of or both the panel 6001a and the panel 6001b may function as a touch panel. In this case, data may be input in such a manner that an image of a keyboard is displayed on one of or both the panel 6001a and the panel 6001b and then touched with a finger 6010 or the like. Alternatively, the display panel and the touch panel may be stacked, so that one of or both the panel 6001a and the panel 6001b are formed. Further alternatively, one of or both the panel 6001a and the panel 6001b may be formed with use of an input-output panel provided with a display circuit and a light detection circuit.

In the electric device illustrated in FIGS. 7A and 7B, the housing 6000a is overlapped with the housing 6000b by moving the housing 6000a or the housing 6000b with use of the hinge 6002, so that the electric device can be folded.

The button 6003 is provided on the housing 6000b. Alternatively, the button 6003 may be provided on the housing 6000a. Further alternatively, a plurality of buttons 6003 may be provided on one of or both the housing 6000a and the housing 6000b. For example, when the button 6003 which is a power button is provided and pushed, the state of the electric device can be controlled, i.e., the electric device can be set to an on state or an off state, by putting the button 6003.

The connection terminal 6004 is provided on the housing 6000a. Alternatively, the connection terminal 6004 may be provided on the housing 6000b. Further alternatively, a plurality of connection terminals 6004 may be provided on one of or both the housing 6000a and the housing 6000b. For example, when the electric device is connected to a personal computer via the connection terminal 6004, data stored in the electric device may be rewritten using the personal computer.

The storage medium insertion portion 6005 is provided on the housing 6000a. Alternatively, the storage medium insertion portion 6005 may be provided on the housing 6000b. Further alternatively, a plurality of storage medium insertion portions 6005 may be provided on one of or both the housing 6000a and the housing 6000b. For example, when a card storage medium is inserted into the storage medium insertion portion, data can be read from the card storage medium and written into to the electric device, or data can be read from the electric device and written to the card storage medium.

The power source portion 6101 has a function of supplying power for driving the electric device. For example, from the power source portion 6101, power is supplied to the wireless communication portion 6102, the arithmetic portion 6103, the audio portion 6104, and the panel portion 6105. The power source portion 6101 is provided with a power storage device 6111. The power storage device 6111 is provided in one of or both the housing 6000a and the housing 6000b. As the power storage device 6111, the power storage device described in Embodiment 2 can be employed. Note that a power supply circuit which generates a power supply voltage for driving the electric device may be provided in the power source portion 6101. In this case, in the power supply circuit, the power supply voltage is generated using power supplied from the power storage device 6111. Further, the power source portion 6101 may be connected to a commercial power supply.

The wireless communication portion 6102 has a function of transmitting and receiving electric waves. For example, the wireless communication portion 6102 is provided with an antenna, a demodulation circuit, a modulation circuit, and the like. In this case, for example, electric waves are transmitted and received at the antenna, whereby data is exchanged with an external device. Note that a plurality of antennas may be provided in the wireless communication portion 6102.

The arithmetic portion 6103 has a function of conducting arithmetic processing in accordance with instruction signals input from the wireless communication portion 6102, the audio portion 6104, and the panel portion 6105, for example. For example, the arithmetic portion 6103 is provided with a CPU, a logic circuit, a memory circuit, and the like.

The audio portion 6104 has a function of controlling input/output of sound that is audio data. For example, the audio portion 6104 is provided with a speaker and a microphone.

The power source portion 6101, the wireless communication portion 6102, the arithmetic portion 6103, and the audio portion 6104 are provided, for example, inside one of or both the housing 6000a and the housing 6000b.

The panel portion 6105 has a function of controlling operation of the panel 6001a (also referred to as panel A) and the panel 6001b (also referred to as panel B). Note that a driver circuit, which controls driving of the panel 6001a and the panel 6001b, is provided in the panel portion 6105, whereby operation of the panel 6001a and the panel 6001b may be controlled.

Note that a control circuit may be provided in one or a plurality of the power source portion 6101, the wireless communication portion 6102, the arithmetic portion 6103, the audio portion 6104, and the panel portion 6105, thereby controlling operation. Further, a control circuit may be provided in the arithmetic portion 6103, thereby controlling operation of one or a plurality of the power source portion 6101, the wireless communication portion 6102, the audio portion 6104, and the panel portion 6105.

Further, a memory circuit may be provided in one or a plurality of the power source portion 6101, the wireless communication portion 6102, the audio portion 6104, and the panel portion 6105, whereby data necessary for operation may be stored in the memory circuit. Thus, operation speed can be improved.

The electric device illustrated in FIGS. 7A and 7B can receive electric power from the commercial power supply and use power stored in the power storage device 6111. Thus, even when electric power cannot be supplied from the commercial power supply because of power outage or the like, the electric device can be operated with use of the power storage device 6111 as a power supply.

When the structure shown in FIGS. 7A and 7B is employed, the electric device can have one or a plurality of functions of a telephone set, an e-book reader, a personal computer, and a game machine, for example.

The foregoing has described an example of an electric device according to this embodiment.

As described with reference to FIG. 6 and FIGS. 7A and 7B, in an example of an electric device according to this embodiment, a power storage device is provided, whereby the electric device can be driven with electric power supplied from the power storage device. Thus, even when, for example, external electric power is not supplied, the electric device can be driven.

Example 1

In this example, $LiFePO_4$ (lithium iron phosphate) formed by a production method described in Embodiment 1 will be described.

First, a production method of $LiFePO_4$ is described.

In the production method of $LiFePO_4$ according to this example, raw materials were weighed so that a molar ratio, $LiOH \cdot H_2O:FeCl_2 \cdot 4H_2O:NH_4H_2PO_4=2:1:1$, was obtained. At this time, Fe was weighed to have a concentration of 0.2 M with respect to 100 ml of water.

Next, in a nitrogen atmosphere, the weighed $LiOH \cdot H_2O$, $FeCl_2 \cdot 4H_2O$, and $NH_4H_2PO_4$ were each dissolved in 30 ml of water which had been subjected to nitrogen bubbling, so that a solution containing Li, a solution containing P, and a solution containing Fe were made.

Next, the solution containing Li was dripped into the solution containing P in a nitrogen atmosphere, so that a solution containing Li and P was made. At this time, $Li_3PO_4$ was deposited in the mixed solution.

Next, the solution containing Fe was dripped into the solution containing Li and P in a nitrogen atmosphere, so that a mixture solution containing Li, P, and Fe was made. At this time, a $LiFePO_4$ precursor was deposited in the mixture solution.

Next, 10 ml of water which had been subjected to nitrogen bubbling was added to the mixture solution. As a result, the amount of the mixture solution was 100 ml. The oxygen concentration of the thus obtained mixture solution was 4.5 ppm.

Next, after the mixture solution was transferred into an autoclave, the solution was reacted for 15 hours at a temperature of 150° C. while being stirred in a nitrogen atmosphere. Note that the pressure at this step was 0.4 MPa.

Then, the solution reacted in the autoclave was filtered in an air atmosphere, and the left compound was washed ten times with pure water. After washing, the compound was dried in a vacuum at a temperature of 50° C.

Through the above steps, $LiFePO_4$ was formed.

In addition, the formed $LiFePO_4$ was observed with a scanning electron micrograph (SEM). The observation result is shown in FIG. 8.

Figure 9:
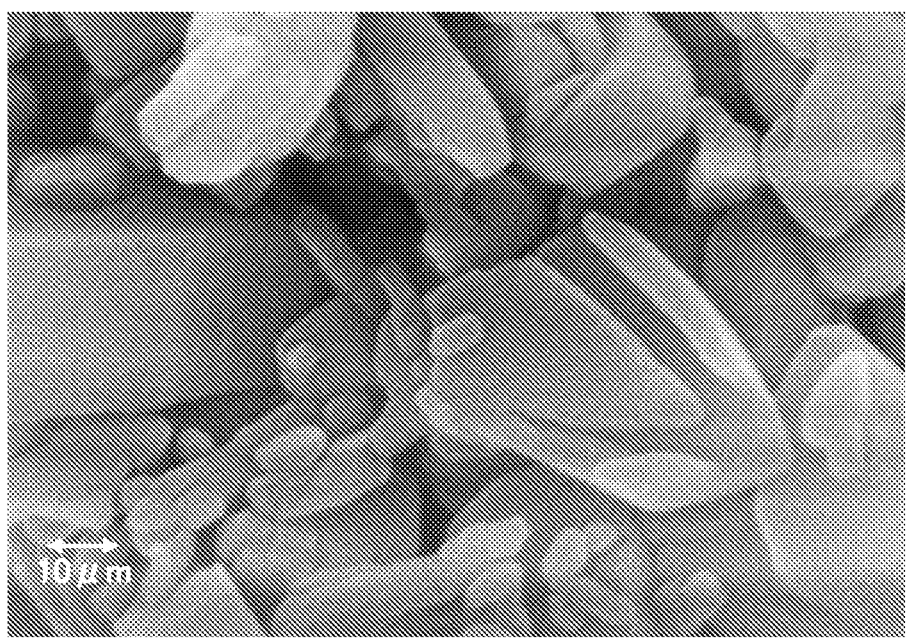
FIG. 9 shows an observation result of $LiFePO_4$, which is a comparison example and obtained with a scanning electron microscope.

Furthermore, a comparison example $LiFePO_4$ was formed. In a process for forming the comparison example $LiFePO_4$, all the treatment was performed in an air atmosphere whereas some of the treatment in the process for forming the above-described $LiFePO_4$ was performed in a nitrogen atmosphere. Other than the atmosphere, the production conditions were the same as those of the above $LiFePO_4$. The formed comparison example $LiFePO_4$ was observed with a SEM. The observation result is shown in FIG. 9.

Figure 8:
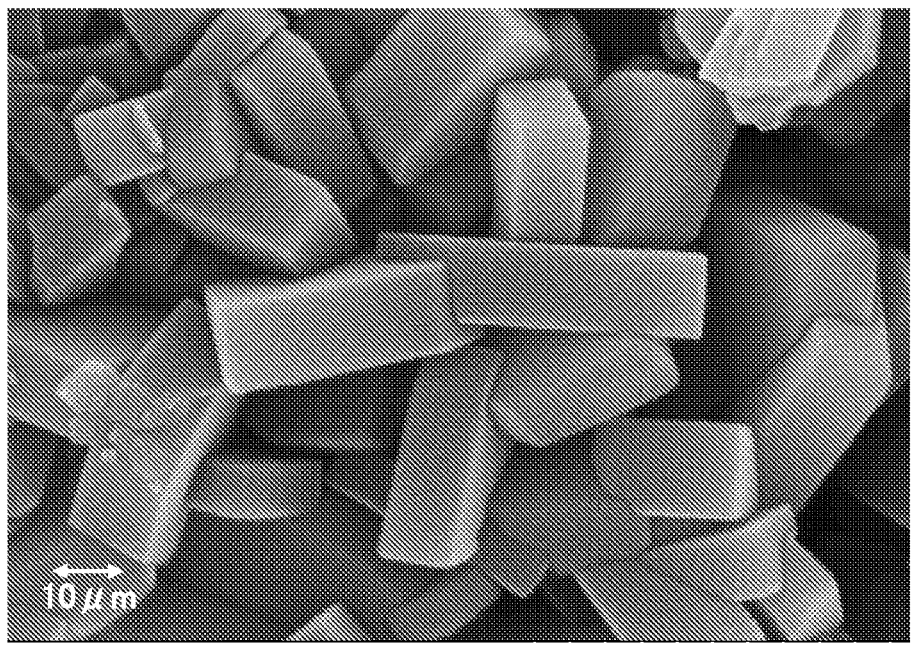
FIG. 8 shows an observation result of $LiFePO_4$, which is obtained with a scanning electron microscope.

As shown in FIG. 8, the $LiFePO_4$ has a plurality of crystals which are rectangular solids. In addition, variation in crystal shape of the $LiFePO_4$ in FIG. 8 is small as compared with that of the $LiFePO_4$ in FIG. 9. The above results indicate that variation in crystal shape in the case where $LiFePO_4$ is formed in a nitrogen atmosphere can be reduced as compared with the case where $LiFePO_4$ is formed in an air atmosphere.

EXPLANATION OF REFERENCE

161: rectangular solid, 201: positive electrode, 202: negative electrode, 203: electrolyte, 204: separator, 211: positive electrode current collector, 212: positive electrode active material layer, 221: negative electrode current collector, 222: negative electrode active material layer, 301: positive electrode, 302: negative electrode, 304: separator, 305: housing, 306: housing, 307: ring-shaped insulator, 308: spacer, 309: washer, 5000: display device, 5001: housing, 5002: display portion, 5003: speaker portion, 5004: power storage device, 5100: lighting device, 5101: housing, 5102: light source, 5103: power storage device, 5104: ceiling, 5105: wall, 5106: floor, 5107: window, 5200: indoor unit, 5201: housing, 5202: ventilation duct, 5203: power storage device, 5204: outdoor unit, 5300: electric refrigerator-freezer, 5301: housing, 5302: door for refrigerator, 5303: door for freezer, 5304: power storage device, 6000a: housing, 6000b: housing, 6001a: panel, 6001b: panel, 6002: hinge, 6003: button, 6004: connection terminal, 6005: storage medium insertion portion, 6010: finger, 6101: power source portion, 6102: wireless communication portion, 6103: arithmetic portion, 6104: audio portion, 6105: panel portion, 6111: power storage device This application is based on Japanese Patent Application serial no. 2011-189027 filed with Japan Patent Office on Aug. 31, 2011, the entire contents of which are hereby incorporated by reference.

What is claimed is:

1. A method for manufacturing a complex oxide comprising the steps of:
preparing a solution comprising lithium by dissolving a compound comprising lithium in water with an oxygen concentration lower than or equal to 4.5 ppm under an atmosphere with an oxygen concentration lower than air;
preparing a solution comprising phosphorous by dissolving a compound comprising phosphorous in water with an oxygen concentration lower than or equal to 4.5 ppm under an atmosphere with an oxygen concentration lower than air;
preparing a solution comprising lithium and phosphorous by mixing the solution comprising lithium and the solution comprising phosphorous under an atmosphere with an oxygen concentration lower than air;
preparing a solution comprising iron by dissolving a compound comprising iron in water with an oxygen concentration lower than or equal to 4.5 ppm under an atmosphere with an oxygen concentration lower than air;
preparing a mixed solution by mixing the solution comprising lithium and phosphorous and the solution comprising iron under an atmosphere with an oxygen concentration lower than air; and obtaining a complex oxide represented by Formula $LiFePO_4$, by performing a hydrothermal method on the mixed solution, wherein the mixed solution is prepared by dripping the solution comprising lithium and phosphorous into the solution comprising iron while mixing the solution comprising iron.

2. A method for manufacturing a complex oxide comprising the steps of:

preparing a solution comprising lithium by dissolving a compound comprising lithium in water degassed by bubbling nitrogen under an atmosphere with an oxygen concentration lower than air;

preparing a solution comprising phosphorous by dissolving a compound comprising phosphorous in water degassed by bubbling nitrogen under an atmosphere with an oxygen concentration lower than air;

preparing a solution comprising lithium and phosphorous by mixing the solution comprising lithium and the solution comprising phosphorous under an atmosphere with an oxygen concentration lower than air;

preparing a solution comprising iron by dissolving a compound comprising iron in water degassed by bubbling nitrogen under an atmosphere with an oxygen concentration lower than air;

preparing a mixed solution by mixing the solution comprising lithium and phosphorous and the solution comprising iron under an atmosphere with an oxygen concentration lower than air; and obtaining a complex oxide represented by Formula $LiFePO_4$, by performing a hydrothermal method on the mixed solution, wherein the mixed solution is prepared by dripping the solution comprising lithium and phosphorous into the solution comprising iron while mixing the solution comprising iron.

* * * * *